United States Patent [19]

Houston

[11] Patent Number: 4,932,002
[45] Date of Patent: Jun. 5, 1990

[54] BIT LINE LATCH SENSE AMP

[75] Inventor: Theodore W. Houston, Richardson, Tex.

[73] Assignee: Texas Instruments, Incorporated, Dallas, Tex.

[21] Appl. No.: 252,287

[22] Filed: Sep. 30, 1988

[51] Int. Cl.⁵ ............................................. G11C 13/00
[52] U.S. Cl. .................................. 365/241; 365/207; 365/190; 365/189.01; 307/530
[58] Field of Search ............... 365/203, 207, 190, 241, 365/189.01; 307/530

[56] References Cited

U.S. PATENT DOCUMENTS

| | | | |
|---|---|---|---|
| 4,516,225 | 5/1985 | Frederick | 365/203 |
| 4,592,026 | 5/1986 | Matsukawa et al. | 365/190 |
| 4,712,194 | 12/1987 | Yamaguchi et al. | 365/203 |
| 4,725,981 | 2/1988 | Rutledge | 365/154 |
| 4,758,990 | 7/1988 | Uchida | 365/203 |
| 4,804,871 | 2/1989 | Walters, Jr. | 365/203 |
| 4,813,022 | 3/1989 | Matsui et al. | 365/203 |

Primary Examiner—Terrell W. Fears
Attorney, Agent, or Firm—Stanton C. Braden; Rodney M. Anderson; Melvin Sharp

[57] ABSTRACT

A bit line latch sense amp is disclosed which substantially eliminates a number of problems associated with prior art sensing schemes which result through asymmetrical operation proximately caused by the use of separate bit line and separate sense amplifier pre-charge circuitry. The invention disclosed herein precharges the sense amplifier and its associated bit line at substantially the same time and does not require separate precharge circuitry for doing so.

10 Claims, 4 Drawing Sheets

BIT LINE LATCH SENSE AMP

This invention was made with government support under contract No. DNA-001-86-0090 awarded by the Defense Nuclear Agency.

BACKGROUND OF THE INVENTION

A typical prior art static random access memory (SRAM) scheme for sensing the logic state of a memory cell is shown in the schematic drawing of FIG. 1.

Loads 2 and 4 for bit lines BL and BL_ respectively, each comprise a n-channel transistor including its gate tied to its source. Bit line pre-charge circuitry comprises n-channel depletion mode transistors 6 and 8 connected to p-channel transistor 10 which is connected to and across bit lines BL and BL_. Bit line capacitances associated with bit lines BL and BL_ are represented by capacitors 12 and 14 respectively between ground and the associated bit line. N-channel bit line transistors 16 and 18 connect bit lines BL and BL_ respectively to sense amplifier (hereinafter also referred to as sense amp) 20 which comprises two cross coupled inverters 22 and 24 each comprising a p-channel transistor including a common drain and gate connection with an n-channel transistor. Inverter 22's p-channel transistor is labeled 25 while its n-channel transistor is labeled 26. Inverter 24's p-channel transistor is labeled 28 while its n-channel transistor is labeled 30. The common drain connection at node A of inverter 22 is connected to the common gate B connection of inverter 24 and in like manner, the common drain connection at node C of inverter 24 is connected to the common gate connection D of inverter 22. Capacitors 34 and 36 represent sense amp capacitance at nodes A and C respectively. Sense amp latch transistor SAL comprises a n-channel transistor with its drain connected to the sources of transistors 26 and 30. Sense amp pre-charge circuitry 32 is connected to bit lines BL and BL_. Memory cells comprising cross-coupled CMOS inverters 3 lie between bit lines BL and BL_ and are connected to the same through pass transistors (PT). The pass transistors are activated by voltages placed on the gates which are connected to an associated word line (WL$_n$, n=12 . . . ) in the SRAM. The foregoing prior art SRAM is built on bulk semiconductor material such as bulk silicon.

The operation of the prior art sensing scheme of FIG. 1 is as follows. Bit lines BL and BL_ are pre-charged by pre-charge circuitry comprising transistors 6, 8 and 10 when turned on by driving their gates to logic low. Under this condition, after a period of time, the voltages on bit lines BL and BL$_{13}$ are balanced through transistor 10 in response to the operation of transistors 6 and 8. Sense amp 20 is then pre-charged by sense amp pre-charge circuitry. Word line WL of a memory cell in the column of cells illustrated is enabled to select a desired memory cell. Sense amp 20 is isolated from bit lines BL and BL_ by pass transistors 16 and 18, since a single sense amp generally serves a block or a number of columns of memory (although for purpose of clarity of explanation, only one column of memory is shown in FIG. 1—Note however, that by having a structure short of a one-to-one correspondence between the columns of memory cells and the sense amps, as is generally found in the prior art, certain computer architecture schemes for accessing memory cells do not achieve their optimum access speed potential). Next, sense amp 20 is connected to bit lines BL and BL_ by turning on transistors 16 and 18 (placing a logic high voltage at their gates). When transistor SAL is turned on sense amp 20 latches the logic states of bit lines BL and BL_. Thus, the logic state of the selected memory can now be sensed by circuitry which is not shown. Pass transistors 16 and 20 are then turned off in order to prepare for the sensing of the logic state of a memory cell from perhaps another column of memory cells.

The sensing scheme illustrated in FIG. 1 depends on symmetrical construction and operation of the elements in the scheme on the right side with the left side. Errors in sensing the correct logic state, arising from asymmetries in the sensing scheme can occur in the prior art sensing scheme illustrated in FIG. 1.

One of these asymmetries in the scheme is unequal capacitance existing at nodes A and C. For instance, if the capacitance at sense amp capacitor 36 is large compared with that of capacitor 334, and bit line BL is high relative to bit line BL_, when sense amp 20 is latched, bit line BL will pull down in voltage faster than BL_ due to the smaller capacitance of capacitor 34, possibly causing the wrong memory cell state to be sensed.

A second asymmetry can arise through the improper pre-charging of sense amp 20 and improper pre-charging of bit lines BL and BL_. For instance node A of sense amp 20 may be inadequately pre-charged with respect to node C or bit line BL_ may be re-charged over sufficiently with respect to bit line BL. In any such case, by the time transistor SAL is turned on, an incorrect differential voltage may exist at nodes A and C of sense amp 20 or bit lines BL and BL_ and as a result two possible improper pre-charge operations arise, namely pre-charging of the bit lines and pre-charging of the sense amp. Thus, sense amp 20 will latch an improper memory cell logic state.

A third asymmetry leading to incorrect sensing arises from non-symmetrical transistor sizes and/or doping. An example of this, as it relates to the sense amp, shall be explained with reference to FIG. 2 which is a schematic drawing of a sense amplifier wherein applicable reference numbers from FIG. 1 have been carried forward. As shown, a threshold voltage Vt is indicated for each transistor as well as a gate voltage, Vg, for n-channel transistors 26 and 30. Asymmetry exists in the transistors 26 and 30 as indicated by their different threshold voltages which in an ideal sense amp should be the same. The source voltage, Vs, for transistors 26 and 30 is 3.5 volts (3.5V) as shown. In order to get understanding of the degree to which the n-channel transistors 26 and 30 are turned on or rather to see the effects of the asymmetry, the difference between the gate to source voltage, Vgs, threshold voltage is calculated for each transistor.

For transistor 26→Vgs−Vt=(4.8−3.5)−0.8=0.5V.
For transistor 30→Vgs−Vt=(5−3.5)−1.2=0.3V.

From the above, it is obvious that transistor 26, considering all else equal, is turned on more strongly than transistor 30. For the case where bit line BL is higher in voltage than bit line BL_ of FIG. 1, this particular asymmetry may result in the sense amp latching the wrong logic state.

It is therefore necessary for the differential voltage between the bit lines to be larger than the voltage differences caused by any asymmetries affecting the latch. Although the foregoing asymmetry problems have been described separately, they can exist simultaneously and therefore possibly compound the severity of the effects of the asymmetry. A need therefore exists to minimize sources of asymmetry and also the amount of asymmetry in the construction and operation of an SRAM sensing scheme.

OBJECTS OF THE INVENTION

It is an object of the invention to provide a new and improved SRAM sensing scheme.

It is another object of the invention to provide a new and improved SRAM sensing scheme which allows fast memory access.

These and other objects of the invention, together with the features and advantages thereof, will become apparant from the detailed specification when read together with the accompanying drawings in which applicable reference numerals have been carried forward.

SUMMARY OF THE INVENTION

The foregoing objects of the invention are accomplished by a sensing scheme, provided for a random access memory, in which a sense amplifier incorporates the bit lines. The sense amp is operable such that pre-charging of the bit lines also accomplishes pre-charging of the sense amp. Therefore, separate circuitry for pre-charging the sense amp is not needed. The scheme also provides one sense amp per column of memory such that a one-to-one correspondence exists between the sense amps and columns of memory.

DETAILED DESCRIPTION OF THE INVENTION

Figure 3A:
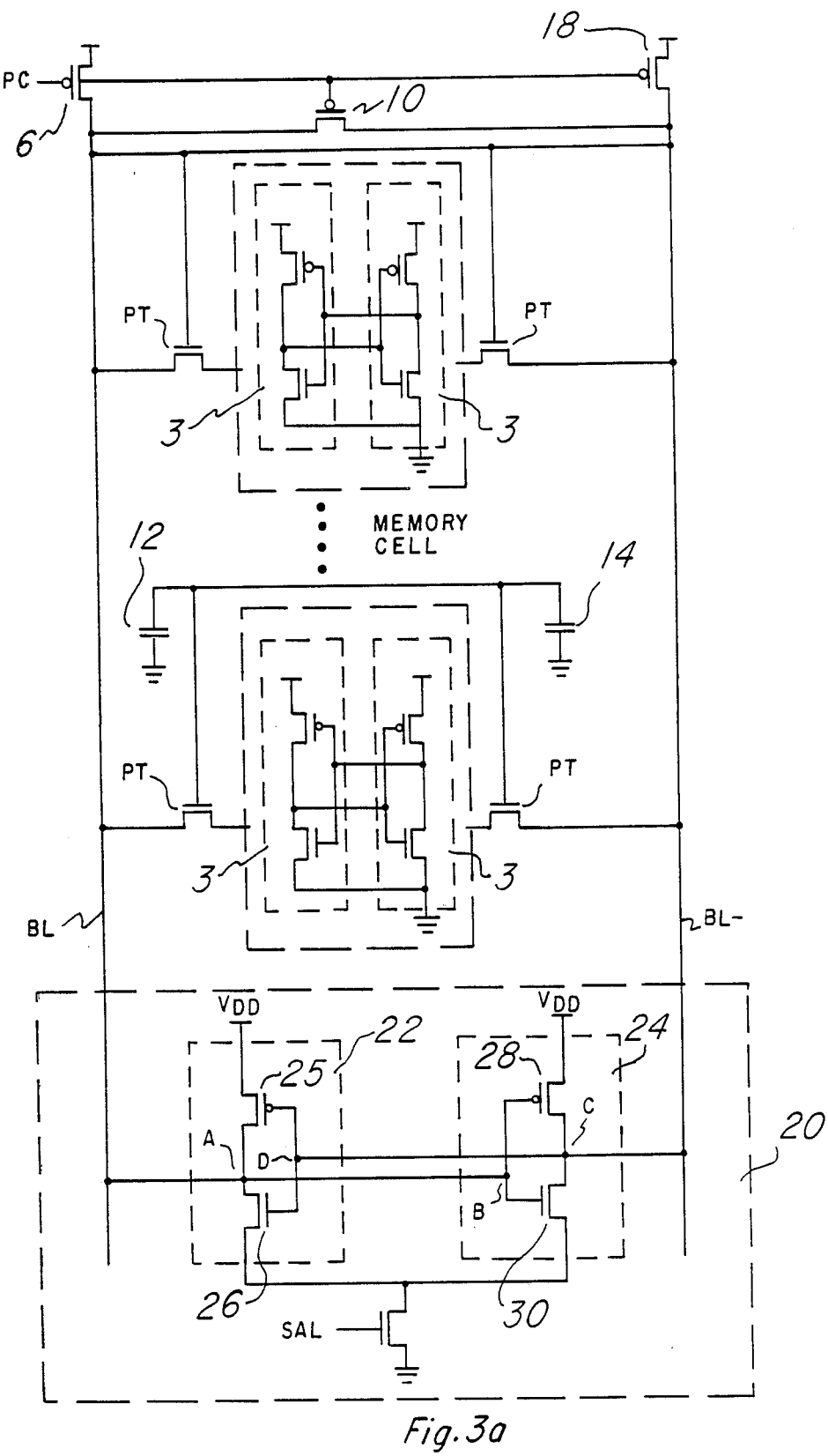
FIG. 3a is a schematic drawing of a preferred embodiment of the invention.
Figure 3B:
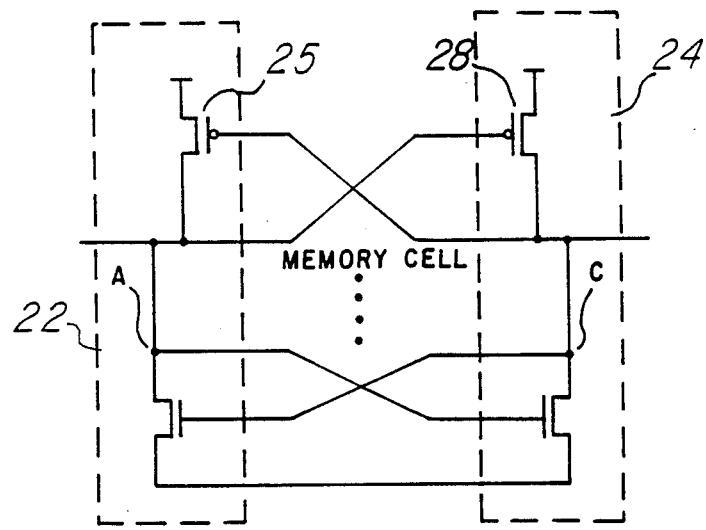
FIG. 3b is a schematic drawing illustrating a compact layout of the invention.

A preferred embodiment of the invention is illustrated in the schematic drawing of FIG. 3. This figure is same as FIG. 1 with the following exceptions: bit line pass transistors 16 and 18 of FIG. 1 have been omitted; sense amp pre-charge circuitry 32 of FIG. 1 has been omitted; n-channel transistor loads 2 and 4 of FIG. 1 have been omitted and sense amp capacitors 34 and 36 of FIG. 1 have been omitted. In operation, bit line BL_ is pulled low in order to write a logic high voltage state into a memory cell. Alternatively, bit line BL is pulled low in order to write a logic low voltage in the memory cell. Sensing of the memory cell state is done directly through the bit lines since bit line pass transistors are not required.

The most practical realization of the present invention arises through construction of the memory on a thin film such as that found in a silicon on insulator (SOI) structure. By building the memory on a thin film, bit line capacitances are reduced in comparison with bit line capacitance associated with a memory built on bulk semiconductor. Therefore, less effort is required of the sense amp when pulling bit lines down in voltage.

The present invention is ideally suited for architectures with short bit lines, as may be present in small logic memories of microprocessors. Unlike the circuit of FIG. 1, a one-to-one correspondence exists between a column of memory and a sense amp in FIG. 3 in that a separate sense amp is provided for each column. The invention eliminates the separate pre-charge circuitry and separate pre-charge instances for the sense amp. Therefore, 5 sources of possible asymmetry induced sensing errors resulting from improper pre-charging have been eliminated due to the fact that the bit lines and sense amp are charged substantially simultaneously by the same pre-charge circuitry comprising transistors 6, 8 and 10. Thus, rather than having 10 possible causes of instances of improper pre-charging as does the circuitry of FIG. 1, that being pre-charging the bit lines (either too long a time, too short a time, charging too much or not enough) through bit line pre-charge circuitry (another source of error) and separately pre-charging the sense amp (either too long a time, too short a time, charging too much or not enough) through sense amp pre-charge circuitry, (another source of error) only half as many sources of possible instances of pre-charging error exist within the circuit of FIG. 3 since all pre-charging is done substantially simultaneously and by the same pre-charge circuit. A more compact layout of the invention interposes the memory cells between the p-channel and n-channel transistor of inverters 22 and 24 is illustrated by the schematic drawing of FIG. 3b.

Figure 1:
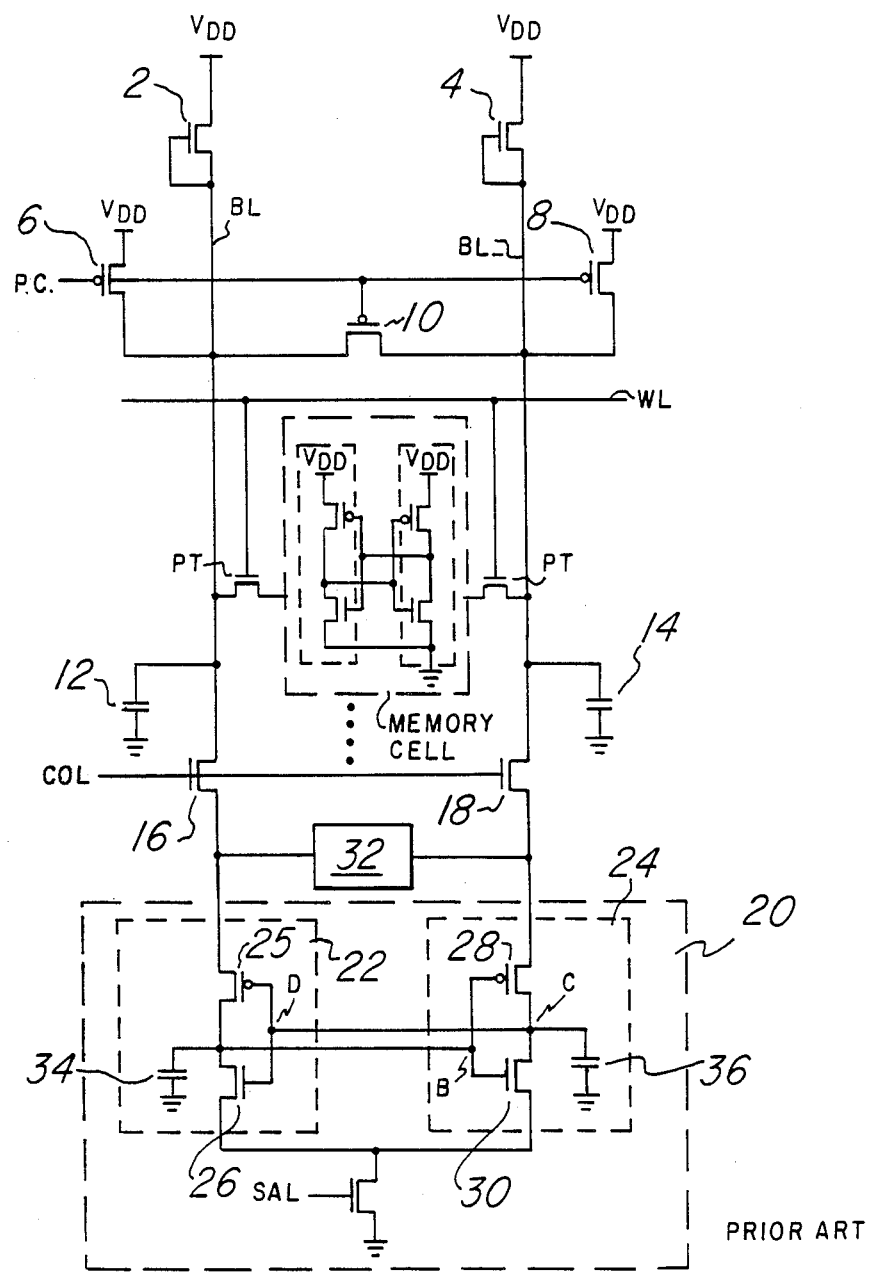
FIG. 1 is a schematic drawing of a typical prior art SRAM.
Figure 2:
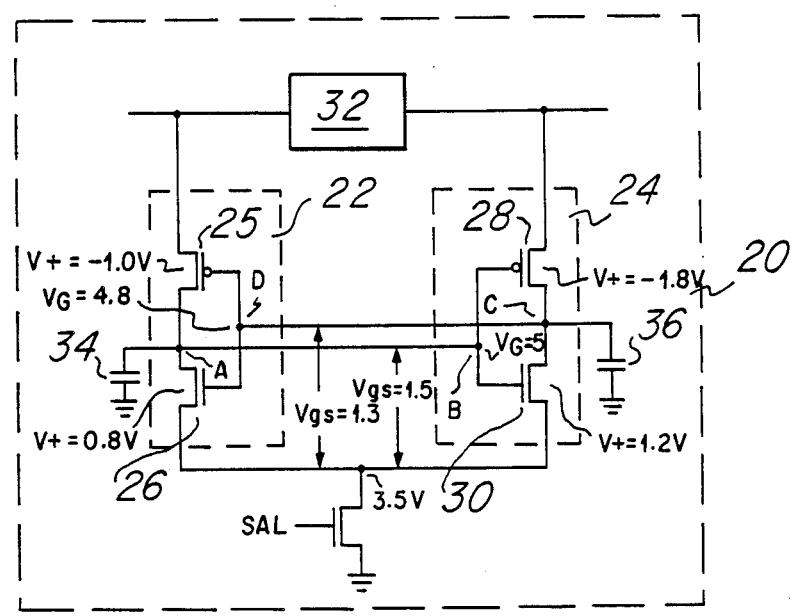
FIG. 2 is a schematic drawing of a prior art sense amp.

Chip real estate is saved by the invention through the elimination of bit line pass transistors 16 and 18 of FIG. 1. Further, the circuits of FIGS. 3a and 3b eliminate two additional sources of asymmetry error since FIG. 1's pass transistor 16 and 18 are each subject to improper operation.

Load transistors 2 and 4 of FIG. 1 have been eliminated from the circuit illustrated in FIG. 3 since p-channel transistors 25 and 28 of sense amp 20 serve as dynamic loads for bit lines BL and BL_ respectively. Gate to source connected load transistors 2 and 4 of FIG. 1 use static power. An advantage of the present invention shown in FIG. 3 is that transistors 25 and 28 do not require static power. Further, the invention is sensitive to a small differential voltage on the bit lines, meaning that a small differential voltage on the bit lines causes a large difference in voltage between bit lines once the sense amp is latched. Asymmetries in the sense amp layout may lead to asymmetries in capacitance. In the invention, however, when this is added to the symmetrical capacitance of the bit lines, the percentage asymmetry in capacitance is small compared to that of the prior art.

Figure 4:
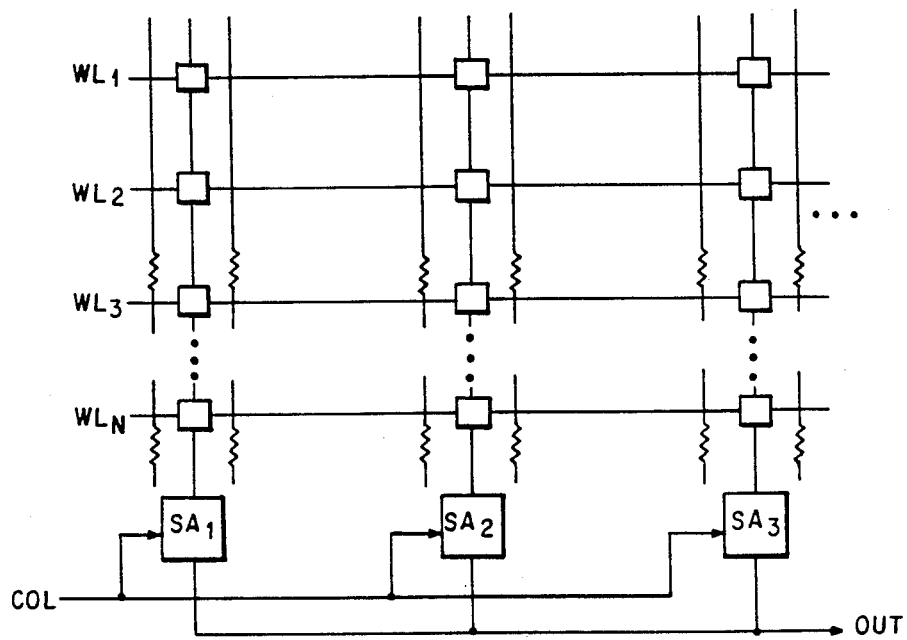
FIG. 4 is a schematic drawing illustrating a section of a block of memory cells in which the invention is incorporated.

A further advantage of the invention is its fast memory cell column access capability. FIG. 4 illustrates a section of a block of memory cells m incorporating the invention which includes word lines $W1_n$ (n=1,2,3 . . . ) and a sense amp $SA_n$ (n=1,2,3 . . . ) per column of memory. Column access circuitry, represented by lines labeled Col is connected to each sense amp $SA_n$. The information latched in a selected sense amp is accessed through an address placed in column access circuitry Col which sends the information to output port out. In architectures which access words sequentially, the memory incorporating the invention can be faster in memory cell access time (regardless of whether the memory is constructed on a thin film or bulk material) than in prior art memory cells, since new data need not be placed in the sense amps when accessing cells sequentially along the same word line. In the prior art, since each column of memory does not uniquely have its own sense amp, time is wasted in reinitializing the sensing scheme and latching new data into the sense amps while sequentially accessing memory cells.

Although the invention has been described in detail herein with reference to its preferred embodiment and certain described alernatives, it is to be understood that this description is by way of example only, and is not to be construed in a limiting sense. It is to be further understood that numerous changes in the details of the embodiments of the invention, and additional embodiments of the invention, will now be apparent to and may be made by, persons or ordinary skill in the art having reference to this description. It is contemplated that all such changes and additional embodiments are within the spirit and true scope of the invention as claimed below.

I claim:

1. A memory sensing apparatus comprising:
    at least one sense amplifier including field effect transistors, a pair of bit lines, each bit line being connected to the drains of selected transistors of an associated at least one sense amplifier and being operable such that pre-charging of the bit lines also accomplishes pre-charging of the sense amplifier.

2. A sensing apparatus as recited in claim 1 wherein each said sense amplifier comprises a pair of inverters cross-coupled such that the output of each inverter of the pair of inverters is connected to the input of the other inverter of the pair, each said sense amplifier further comprising a sense amp latch connected to said pair of cross-coupled inverters.

3. A sensing apparatus as recited in claim 2 wherein each inverter of said pair comprises a p-channel transistor and an n-channel transistor, said p-channel transistor and n-channel transistor including common drains and common sources with one another.

4. A sensing apparatus as recited in claim 3 wherein said n-channel and p-channel transistors are metal oxide semiconductor transistors.

5. A static random access memory including the sensing apparatus recited in claim 1 wherein the static random access memory further includes:
    at least one memory cell connected to a first terminal of a first switch and a first terminal of a second switch; and
    a second terminal of said first and second switches being connected to associated bit lines of a pair of bit lines, said bit lines being directly connected to an associated sense amplifier.

6. A static random access memory as recited in claim 5 which further includes circuitry connected to said bit lines operable for precharging said bit lines and their associated sense amplifiers.

7. A static random access memory as recited in claim 5 wherein said sense amplifier includes a pair of inverters with each inverter including a load transistor and a drive transistor connected through an associated bit line, said load and drive transistors being cross-coupled such that the input of each inverter of the pair is connected to the output of the other inverter of the pair.

8. A static random memory as recited in claim 7 wherein at least one memory cell is physically located between said load transistors and said drive transistors of a cross-coupled inverter of said sense amplifier.

9. A sensing apparatus for a memory comprising:
    at least one sense amplifier, each sense amplifier being coupled to an associated pair of bit lines and being operable such that pre-charging of the bit lines also accomplishes pre-charging of the sense amplifier.

10. A sensing apparatus comprising:
    a plurality of sense amplifiers, said sense amplifiers being coupled in a one-to-one correspondence with said columns of memory cells;
    a plurality of pairs of bit lines, each pair of bit lines associated with both a column of memory cells and a sense amplifier; and
    means for precharging at substantially the same time a sense amplifier and its associated bit line pair.

* * * * *